United States Patent
Verjus et al.

(10) Patent No.: US 8,237,256 B2
(45) Date of Patent: Aug. 7, 2012

(54) INTEGRATED PACKAGE

(75) Inventors: Fabrice Verjus, Creully (FR); Jean-Marc Yan-Nou, Colomby sur Thaon (FR); David Chevrie, Bretteville sur Odon (FR); Francois LeCornec, Luc sur Mer (FR); Nicolaas J. A. Van Veen, Geldrop (NL)

(73) Assignee: Ipdia, Caen (FR)

( * ) Notice: Subject to any disclaimer, the term of this patent is extended or adjusted under 35 U.S.C. 154(b) by 334 days.

(21) Appl. No.: 12/702,041

(22) Filed: Feb. 8, 2010
(Under 37 CFR 1.47)

(65) Prior Publication Data

US 2010/0308450 A1 Dec. 9, 2010

Related U.S. Application Data

(63) Continuation of application No. 11/721,435, filed as application No. PCT/IB2005/054119 on Dec. 8, 2005, now abandoned.

(30) Foreign Application Priority Data

Dec. 10, 2004 (EP) .................................. 04300878

(51) Int. Cl.
*H01L 23/538* (2006.01)
(52) U.S. Cl. .. 257/690; 257/737; 257/704; 257/E21.506
(58) Field of Classification Search .................. 257/696, 257/737, E21.506, E23.023, E23.169, 704; 438/121
See application file for complete search history.

(56) References Cited

U.S. PATENT DOCUMENTS

| | | | |
|---|---|---|---|
| 5,049,978 A | 9/1991 | Bates et al. | |
| 6,163,458 A * | 12/2000 | Li | 361/704 |
| 6,465,281 B1 | 10/2002 | Xu et al. | |
| 6,479,320 B1 | 11/2002 | Gooch | |
| 6,515,355 B1 * | 2/2003 | Jiang et al. | 257/678 |
| 6,661,084 B1 | 12/2003 | Peterson et al. | |

(Continued)

FOREIGN PATENT DOCUMENTS

| EP | 1 251 577 A2 | 10/2002 |
|---|---|---|
| EP | 1 433 742 A2 | 6/2004 |
| EP | 1 433 742 A3 | 7/2005 |

OTHER PUBLICATIONS

International Search Report of PCT/IB2005/054119, dated Jun. 21, 2006.

*Primary Examiner* — Roy Potter
(74) *Attorney, Agent, or Firm* — Hamre, Schumann, Mueller & Larson, P.C.

(57) ABSTRACT

A device substrate has a device major surface, a semiconductor element on the device major surface, and electrically conductive device connectors extending across the device major surface. An interconnection substrate has an interconnection substrate having an interconnection major surface, the interconnection substrate defining at least one sealing recess recessed from the interconnection major surface, the sealing recess being surrounded by a sealing ring. The device substrate is mounted on the interconnection substrate with the interconnection major surface facing the device major surface, the sealing ring around the semiconductor element and with the device major surface sealed against the sealing ring so that the recess forms a sealed cavity containing the semiconductor element. Electrical interconnects extend across the interconnection major surface. Interconnection bumps are provided outside the sealing ring to electrically connect the device to the interconnect substrate.

11 Claims, 2 Drawing Sheets

U.S. PATENT DOCUMENTS

| | | |
|---|---|---|
| 6,713,876 B1 | 3/2004 | Vittu et al. |
| 7,348,215 B2 * | 3/2008 | Lee .............................. 438/108 |
| 7,462,936 B2 * | 12/2008 | Haba et al. ................... 257/737 |
| 7,816,251 B2 * | 10/2010 | Haba et al. ................... 438/613 |
| 2002/0043706 A1 | 4/2002 | Jerominek et al. |
| 2003/0073292 A1 | 4/2003 | Bartlett et al. |
| 2004/0077154 A1 | 4/2004 | Nagarajan et al. |
| 2004/0087043 A1 | 5/2004 | Lee et al. |

* cited by examiner

INTEGRATED PACKAGE

The invention relates to packaging of integrated circuits and in particular to packaging of integrated circuits including elements which are to be packaged in a hermetically sealed cavity.

There is an increasing demand for thinner packages. Further, there is an increasing demand for combining more than one device, in a single package, often known as a "system in package" (SIP). This packaged device may be a complete module. Thus, there is a need for thinner devices.

Some devices include sensitive elements that need to be packaged in a hermetic enclosure. Such devices include micro electro-mechanical systems (MEMS) devices, acoustic wave filters and resonators. This requirement of a hermetic enclosure increases the thickness of these devices to be greater than regular pre-packaged devices or bare die circuits, which can make them difficult to include in a SIP.

One existing solution for the hermetic packaging of devices is known as chip scale packaging (CSP). In this approach, the device includes a substrate which carries the sensitive element. The sensitive element is mounted in a package body which is sealed with a lid. Normally the package body is made of plastics material. This approach amounts to a small conventional package and the size and in particular the thickness of the device can often compromise its inclusion in a module.

An alternative approach is wafer level packaging (WLP). In this approach, illustrated in FIG. 1, a substrate 2 has a sensitive element 4 on one surface 6. A lid 8 is sealed to this surface 6 defining a cavity 10 containing the sensitive element. Vias 12 through the lid 8 provide electrical connections to the substrate and flip chip bumps 14 are provided on the vias to allow the wafer lever package to be bonded within a module.

However, when mounted on a module substrate such a WLP package remains significantly thicker than a bare die.

According to the invention, there is provided an integrated semiconductor device including:

a device substrate with a device major surface, a semiconductor element on the device major surface, and electrically conductive device connectors extending across the device major surface; and an interconnection substrate having an interconnection major surface, the interconnection substrate defining at least one sealing recess recessed from the interconnection major surface, the sealing recess being surrounded by a sealing ring;

wherein the device substrate is mounted on the interconnection substrate with the interconnection major surface facing the device major surface, the sealing ring around the semiconductor element and with the device major surface sealed against the sealing ring so that the recess forms a sealed cavity containing the semiconductor element;

the integrated semiconductor device further comprising:

electrical interconnects across the interconnection major surface; and interconnection bumps outside the sealing ring, the interconnection bumps electrically connecting the device electrical connectors to the interconnects.

By using this approach a semiconductor element that requires hermetic sealing can be mounted as a bare die on the integration substrate, the sealing ring sealing the semiconductor element as required. Thus, the invention provides a sealed electrical element in a thin arrangement. The total thickness of the mounted device is no thicker than the sum of the device and interconnection substrate thicknesses. Thus, a device substrate requiring hermetic sealing can be mounted in a way that results in no greater thickness than a simple bare die not requiring any such sealing.

The device preferably includes at least one bonding trench on the interconnect major surface around the sealing ring. The bonding trench may accommodate one or more of the interconnection bumps. The trench may conveniently be a trench completely surrounding the sealing ring, i.e. in the form of a ring trench concentrically around the sealing ring, or alternatively, there may be a plurality of bonding trenches around the sealing ring each to hold one or more of the interconnect bumps.

In this way conventional bump bonding of the device and interconnection substrates may be provided without interfering with the sealing of the sealing ring or increasing the thickness of the substrate.

In preferred embodiments there is at least one additional semiconductor device mounted on the interconnection substrate. The device substrate may be connected to the at least one additional semiconductor device by the electrical interconnects. Thus, the integration substrate itself is the substrate interconnecting the various semiconductor components of a module. It should be noted that the additional semiconductor devices may be mounted for hermetic sealing in the same way as the first semiconductor device or they may be mounted conventionally.

The interconnection substrate may define a device recess for holding the semiconductor device, the semiconductor device, the sealing ring and sealing recess being provided within the device recess. This reduces the overall thickness still further.

Preferably, the semiconductor device does not extend beyond the interconnection major surface. In this way, the thickness of the semiconductor device and integration substrate together does not exceed that of the integration substrate.

In embodiments, this may be used to create an extremely thin device.

An additional semiconductor device may be mounted on the interconnection major surface extending above the device recess. Thus, the use of a device recess allows the additional device to overlap the device in the device recess, saving space.

The integration substrate may be of silicon. Silicon represents a convenient material in which to form the sealing recess, the sealing ring and (if required) the bonding trench and the device recess.

In another aspect there is provided a method of mounting a device substrate having a device major surface, a semiconductor element on the device major surface, and device electrical connectors on the device major surface, the method comprising:

providing an interconnection substrate having an interconnection major surface and electrical interconnects across the interconnection major surface, the interconnection substrate defining at least one sealing recess recessed from the interconnection major surface, the sealing recess being surrounded by a sealing ring;

forming interconnection bumps on the electrical interconnects or the electrical connection pads;

aligning the device substrate with the interconnection substrate with the interconnection major surface facing the device major surface, with the sealing ring around the semiconductor element; and with the interconnection bumps aligned between the device electrical connectors and the interconnects; and bonding the device substrate to the interconnection substrate with the device major surface sealed against the sealing ring so that the recess forms a sealed cavity containing the semiconductor element and with the interconnection bumps connect the device electrical connectors and the electrical interconnects.

Preferably, the step of providing an interconnection substrate includes:

etching the sealing recess and at least one bonding trench around the sealing recess in the interconnection major surface of a substrate; and depositing the electrical interconnect on the interconnection major surface including in the at least one bonding trench.

In another aspect, the invention relates to an interconnection substrate for mounting a device substrate having a device major surface, a semiconductor element on the device major surface, and device electrical connectors on the device major surface, wherein the interconnection substrate comprises:

an interconnection major surface;

electrical interconnects extending across the interconnection major surface;

at least one sealing recess recessed from the interconnection major surface;

a sealing ring surrounding the sealing recess;

bonding pads around and outside the sealing ring for connecting through interconnection bumps to the device electrical connectors on the device major surface so that the device substrate may be mounted on the interconnection substrate with the interconnection major surface facing the device major surface, with the sealing ring around the semiconductor element and with the device major surface sealed against the sealing ring so that the recess forms a sealed cavity containing the semiconductor element.

Embodiments of the invention will now be described, purely by way of example, with reference to the accompanying drawings in which.

Like components are given like reference numerals in the different figures, which are purely schematic and not to scale.

Figure 2:
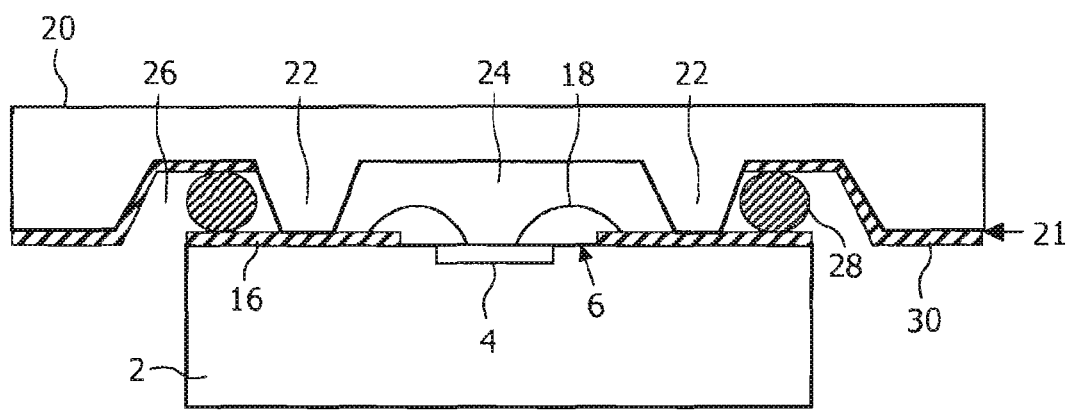
FIG. 2 shows a side section of a first embodiment of the invention.

Referring to FIG. 2, a silicon semiconductor device substrate 2 has a surface acoustic wave (SAW) filter device element 4 on a first major surface 6 which will be referred to as a device major surface below. The device major surface 6 of the silicon substrate has device electrical connectors 16 running along it which are connected to the device element 4 by bond wires 18. Alternatively, connection may be made by means of an underlying conductive layer, or layers, within the device substrate 2.

Another semiconductor substrate 20 acts as a passive interconnection substrate. This interconnection substrate 20 may be seen in side view in FIG. 2 and in top view in FIG. 3.

The interconnection substrate 20 has a first major surface 21 which will be referred to as the interconnection major surface 21 to avoid confusion with the device major surface 6.

To provide a mounting point for a device, a recess 24 is formed in the interconnection major surface. Around the recess 24, there is provided another recess 26 in the form of a ring around the recess 24 which will be referred to as a bonding trench 26 for reasons which will be come apparent later.

Between the recess 24 and bonding trench 26 there is a ring shaped portion of the interconnection substrate which will be referred to as the sealing ring 22. The sealing ring 22 extends around the whole of the recess 24. The sealing ring 22 in the embodiment is thus at the level of the second major surface 21, and is accordingly raised with respect to the recess 24.

Figure 3:
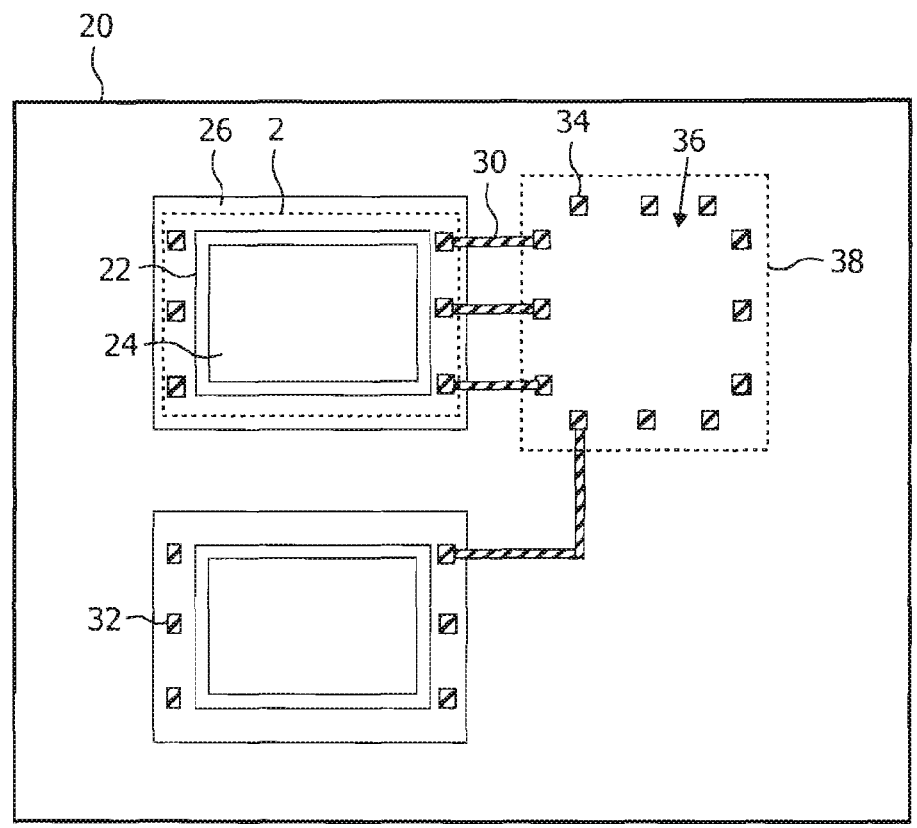
FIG. 3 shows a top view of a first embodiment of the invention.

Metallic interconnections 30 are provided on the interconnection substrate 20 extending into the bonding trench 26. As shown in FIG. 3, the ends of these interconnections 30 are broadened to provide bonding pads 32.

The interconnection substrate is conveniently of silicon which makes it straightforward to fabricate the recess 24, trench 26 and sealing ring 22, as well as to deposit the interconnect 30.

In use, to mount the silicon substrate 2 on the interconnection substrate 20, bonding "bumps" 28 are formed on the interconnections 16 on the device major surface. Any suitable material may be used to form these bumps and the skilled person will be aware of a number of such single materials or material combinations. The silicon substrate is arranged so that the device major surface 6 faces the interconnection major surface 21 with the MEMS element 4 facing the recess 24.

The device substrate 2 and interconnection substrate 20 are then brought together so that the device major surface contacts the sealing ring 22, the recess 24 thus forming a hermetically sealed cavity 24 sealing the device element 4.

At the same time, the bonding bumps 28 contact the bonding pads 32. Bonding of the bonding bumps may follow using techniques known to those skilled in the art, for example by reflowing the bonding bumps 28 in the case that the bumps are solder bumps or by the simple application of pressure or heat and pressure. It will be noted that the bumps 28 end up in the bonding trench 26 and so any extra thickness caused by the bumps does not increase the thickness of the finished device.

By arranging the bonding bumps outside the sealing ring the sealing of the sealing ring is essentially independent of the electrical interconnects.

Moreover, if a reflow process is used to melt the bonding bumps, the capillary action of the melted bonding bumps will tend to urge the substrates together thus assisting a good seal.

As may be seen in FIG. 3, the interconnection substrate includes a number of recesses 24, each used to bond a separate substrate 2. For clarity, only one such substrate 2 is shown in a dotted line in FIG. 3.

The same interconnection substrate may also be used to mount conventional chips 38 that do not require hermetic sealing. These chips may be mounted on additional chip mounting points 36 which have a plurality of bonding pads 34 connected to interconnects 30. The additional chip mounting points 36 in this embodiment do not have recesses or bonding trenches and may conveniently be flat to avoid the need for excessive processing. However, in alternative embodiments all additional chips may be mounted in like manner to the device substrate 2 needing to be hermetically sealed.

Figure 4:
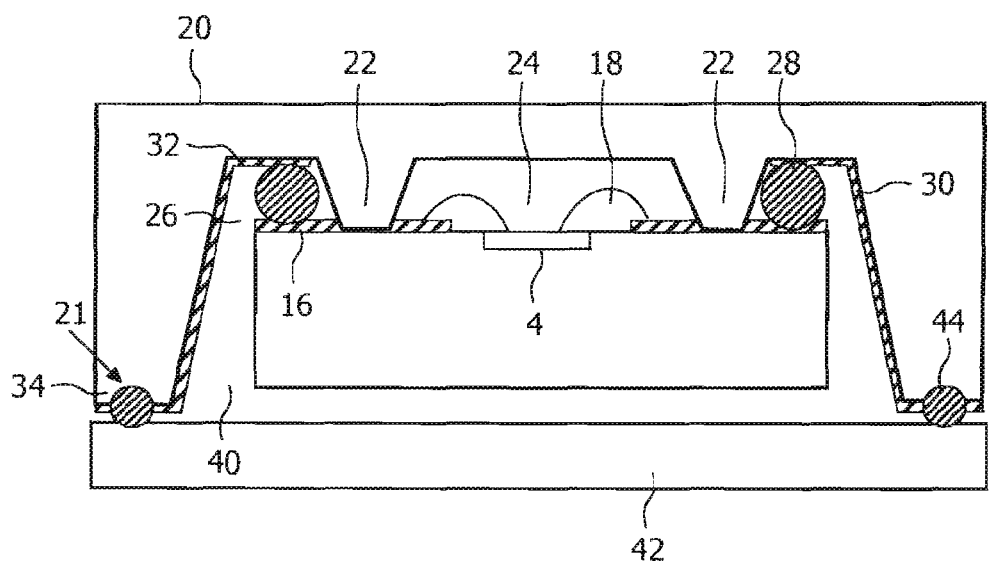
FIG. 4 shows a side section of a second embodiment of the invention.

FIG. 4 shows a second embodiment in which device recesses 40 are provided in the interconnection substrate 20. These recesses are large enough to accommodate the device substrate 2.

In this embodiment, the device element is a MEMS element 4.

Figure 1:
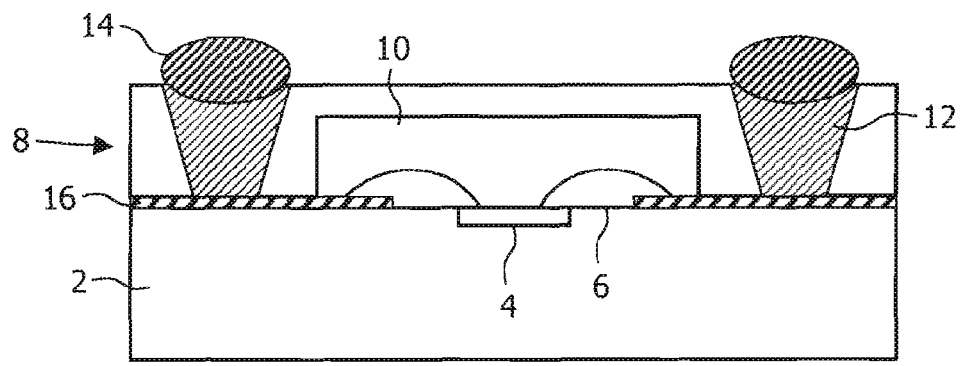
FIG. 1 shows a prior art package.

The sealing ring 22, the recess 24 and the bonding trench 26 are provided at the base of the device recess. When the device substrate 2 is mounted as in the embodiment of FIG. 1 the device substrate 2 is wholly contained in the device recess 40 and does not extend beyond the interconnection major surface 21.

This means that the total thickness of interconnection substrate 20 and device substrate 2 is not greater than that of the interconnection substrate 20.

A further benefit of this approach is that an additional device 42 may be mounted over the device recess 40, using additional bumps 44 to connect to bonding pads 34 which in turn are connected to interconnects 30 which in the example shown connect through bonding pads 32, bonding bumps 28, interconnections 16 and bonding wires 18 to the MEMS device element 4.

Thus, in this embodiment the additional device 42 effectively overlaps the device 2 thus saving area of interconnection substrate 20.

Both the first and second embodiments can readily be implemented without excessive processing cost.

Various modifications of these embodiments are possible.

The mounting technique described is not just useful for bonding SAW or MEMS devices, but may be used for any device, especially those with sensitive elements requiring a hermetically sealed cavity. The substrate 2 need not be of silicon, but may be another semiconductor such as GaAs or InP, or insulator such as quartz or sapphire or any other substrate material as will be appreciated by those skilled in the art.

The interconnection substrate 20 need not necessarily be made of silicon but other materials including ceramics or plastics may also be used.

Optionally, additional sealing material may be provided, especially on the sealing ring 22, if required to improve the seal. However, this is not usually required.

Although in the above embodiments the interconnection substrate is passive active substrates including active devices may be used if required.

If a device recess in the interconnection substrate is used, the device substrate may in embodiments extend above the level of the interconnection major surface.

The additional devices in the described embodiments are attached using bump technology. However, it is also possible to mount additional devices on the interconnection substrate in any known way, including for example by attaching them with the inactive side facing the substrate and then using wire bonding to electrically connect them to the interconnects.

The invention claimed is:

1. An integrated semiconductor device including:
   a device substrate with a device major surface, a semiconductor element on the device major surface, and electrically conductive device connectors extending across the device major surface; and
   an interconnection substrate having an interconnection major surface, the interconnection substrate defining at least one sealing recess recessed from the interconnection major surface, the sealing recess being surrounded by a sealing ring;
   wherein the device substrate is mounted on the interconnection substrate with the interconnection major surface facing the device major surface, the sealing ring around the semiconductor element and with the device major surface sealed against the sealing ring so that the recess forms a sealed cavity containing the semiconductor element;
   the integrated semiconductor device further comprising:
   electrical interconnects across the interconnection major surface; and
   interconnection bumps outside the sealing ring, the interconnection bumps electrically connecting the device electrical connectors to the interconnects.

2. An integrated semiconductor device according to claim 1 further comprising at least one bonding trench around the sealing ring on the interconnect major surface for accommodating one or more of the interconnection bumps.

3. An integrated semiconductor device according to claim 1 further comprising at least one additional semiconductor device mounted on the interconnection substrate; wherein the device substrate is connected to the at least one additional semiconductor device by the interconnects.

4. An integrated semiconductor device according to claim 1 wherein the interconnection substrate defines a device recess for holding the device substrate, wherein the sealing ring and sealing recess are provided within the device recess.

5. An integrated semiconductor device according to claim 4 further comprising an additional semiconductor device mounted on the interconnection substrate; wherein the additional semiconductor device is mounted on the interconnection major surface and extends across the device recess.

6. An integrated semiconductor device according to claim 1 wherein the interconnection substrate is of silicon.

7. An interconnection substrate for mounting a device substrate having a device major surface, a semiconductor element on the device major surface, and device electrical connectors on the device major surface, wherein the interconnection substrate comprises:
   an interconnection major surface;
   electrical interconnects extending across the interconnection major surface;
   at least one sealing recess recessed from the interconnection major surface;
   a sealing ring surrounding the sealing recess;
   bonding pads around and outside the sealing ring for connecting through interconnection bumps to the device electrical connectors on the device major surface so that the device substrate may be mounted on the interconnection substrate with the interconnection major surface facing the device major surface, with the sealing ring around the semiconductor element and with the device major surface sealed against the sealing ring so that the recess forms a sealed cavity containing the semiconductor element.

8. An interconnection substrate according to claim 7 further comprising at least one bonding trench for accommodating one or more interconnection bumps around the sealing ring.

9. A method of mounting a device substrate having a device major surface, a semiconductor element on the device major surface, and device electrical connectors on the device major surface, the method comprising:
   providing an interconnection substrate having an interconnection major surface and electrical interconnects across the interconnection major surface, the interconnection substrate defining at least one sealing recess recessed from the interconnection major surface, the sealing recess being surrounded by a sealing ring;
   forming interconnection bumps on the electrical interconnects or the electrical connection pads;
   aligning the device substrate with the interconnection substrate with the interconnection major surface facing the device major surface, with the sealing ring around the semiconductor element; and with the interconnection bumps aligned between the device electrical connectors and the interconnects; and
   bonding the device substrate to the interconnection substrate with the device major surface sealed against the sealing ring so that the recess forms a sealed cavity containing the semiconductor element and with the interconnection bumps connect the device electrical connectors and the electrical interconnects.

10. A method according to claim 9 wherein the step of providing an interconnection substrate includes:
    etching the sealing recess and at least one bonding trench around the sealing recess in the interconnection major surface; and
    depositing the electrical interconnect on the interconnection major surface including in the at least one bonding trench.

11. A method according to claim 9 wherein the step of bonding the device substrate to the interconnection substrate includes melting the interconnection bumps and allowing the melted interconnection bumps to solidify.

* * * * *

UNITED STATES PATENT AND TRADEMARK OFFICE
CERTIFICATE OF CORRECTION

PATENT NO. : 8,237,256 B2  
APPLICATION NO. : 12/702041  
DATED : August 7, 2012  
INVENTOR(S) : Verjus et al.

Page 1 of 1

It is certified that error appears in the above-identified patent and that said Letters Patent is hereby corrected as shown below:

Title Page, Item (75) Inventors: "Jean-Marc Yan-Nou," should read --Jean-Marc Yannou,--

Signed and Sealed this  
Fifth Day of February, 2013

Teresa Stanek Rea  
*Acting Director of the United States Patent and Trademark Office*